United States Patent
Wang et al.

(10) Patent No.: US 12,003,844 B2
(45) Date of Patent: Jun. 4, 2024

(54) CAMERA ASSEMBLY AND ELECTRONIC DEVICE

(71) Applicant: HUAWEI TECHNOLOGIES CO., LTD., Guangdong (CN)

(72) Inventors: Xin Wang, Shenzhen (CN); Hongbo Luo, Dongguan (CN); Kuni Lee, Shenzhen (CN); Linghui Zeng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 27 days.

(21) Appl. No.: 17/848,471

(22) Filed: Jun. 24, 2022

(65) Prior Publication Data

US 2022/0329712 A1 Oct. 13, 2022

Related U.S. Application Data

(63) Continuation of application No. PCT/CN2020/138565, filed on Dec. 23, 2020.

(30) Foreign Application Priority Data

Dec. 26, 2019 (CN) .......................... 201911371359.9

(51) Int. Cl.
*H04N 23/57* (2023.01)
*H04N 23/51* (2023.01)

(52) U.S. Cl.
CPC ............. *H04N 23/57* (2023.01); *H04N 23/51* (2023.01)

(58) Field of Classification Search
None
See application file for complete search history.

(56) References Cited

U.S. PATENT DOCUMENTS

| 2005/0024500 A1* | 2/2005 | Katayama .............. H04N 23/54 348/207.99 |
| 2009/0201399 A1 | 8/2009 | Senga |
| 2010/0309323 A1 | 12/2010 | Shin et al. |

(Continued)

FOREIGN PATENT DOCUMENTS

| CN | 101976010 A | 2/2011 |
| CN | 102447825 A | 5/2012 |

(Continued)

OTHER PUBLICATIONS

English translation of CN-112640416-A, Song L, Apr. 2021 (Year: 2021).*

(Continued)

*Primary Examiner* — James M Hannett

(57) ABSTRACT

A camera assembly or an electronic device includes a camera and a flexible circuit board. The camera can swing around at least one of a first axis, a second axis, and a third axis, where the third axis is used as an optical axis of the camera. In an extension direction of the flexible circuit board, one end of the flexible circuit board is connected to a circuit board in the camera, and the other end of the flexible circuit board is fastened to and electrically connected to a mainboard. A bent redundant structure for releasing stress is disposed between the two ends of the flexible circuit board. The redundant structure can extend in a direction of rotation around at least one of the first axis, the second axis, or the third axis.

20 Claims, 9 Drawing Sheets

(56) References Cited

U.S. PATENT DOCUMENTS

| | | | |
|---|---|---|---|
| 2014/0063821 A1 | | 3/2014 | Hegde et al. |
| 2017/0336019 A1* | | 11/2017 | Liu .................. B65H 75/4486 |
| 2018/0284476 A1* | | 10/2018 | Minamisawa ....... H05K 1/0281 |

FOREIGN PATENT DOCUMENTS

| | | | | |
|---|---|---|---|---|
| CN | 104994304 A | | 10/2015 | |
| CN | 105556383 A | | 5/2016 | |
| CN | 107390456 A | | 11/2017 | |
| CN | 107396529 A | | 11/2017 | |
| CN | 206723741 U | | 12/2017 | |
| CN | 207560456 U | | 6/2018 | |
| CN | 108668067 A | | 10/2018 | |
| CN | 108777762 A | | 11/2018 | |
| CN | 109375334 A | | 2/2019 | |
| CN | 110290238 A | | 9/2019 | |
| CN | 111416925 A | | 7/2020 | |
| CN | 112640416 A | * | 4/2021 | ............ H01F 7/081 |
| JP | H0557970 U | | 7/1993 | |
| JP | H08201880 A | | 8/1996 | |
| JP | 2011232708 A | | 11/2011 | |
| JP | 2015031898 A | | 2/2015 | |
| JP | 5730219 B2 | | 6/2015 | |
| JP | 2019020467 A | | 2/2019 | |
| JP | 2020086369 A | | 6/2020 | |
| JP | 2021015235 A | | 2/2021 | |
| KR | 20140023822 A | | 2/2014 | |
| TW | 201518850 A | * | 5/2015 | ........... G02B 27/646 |
| WO | WO-2021063243 A1 | * | 4/2021 | ........... G02B 27/646 |

OTHER PUBLICATIONS

English translation of WO-2021063243-A1, Cheng D, Apr. 2021 (Year: 2021).*

English translation of TW-201518850-A, Asakawa S, May 2015 (Year: 2015).*

Office Action dated Nov. 30, 2021 issued for Chinese Application No. 201911371359.9 (11 pages).

Extended European Search Report dated Dec. 16, 2022 issued for European Application No. 20906326-2 (7 pages).

International Search Report and Written Opinion of the International Searching Authority dated Mar. 22, 2021 issued for International Application No. PCT/CN2020/138565 (10 pages).

Notice of Reason(s) for Rejection dated May 23, 2023 issued for Japanese Application No. 2022-539095 (9 pages) and English Translation (10 pages).

Office Action issued in KR10-2022-7025327, dated Mar. 15, 2024, with English Translation, 13 pages.

Office Action issued in JP2022-539095, dated Mar. 19, 2024, with English translation, 6 pages.

* cited by examiner

CAMERA ASSEMBLY AND ELECTRONIC DEVICE

CROSS-REFERENCE TO RELATED APPLICATIONS

This application is a continuation of International Application No. PCT/CN2020/138565, filed on Dec. 23, 2020, which claims priority to Chinese Patent Application No. 201911371359.9, filed on Dec. 26, 2019. The disclosures of the aforementioned applications are hereby incorporated by reference in their entireties.

TECHNICAL FIELD

This disclosure relates to the field of image stabilization shooting technologies, and in particular, to a camera assembly and an electronic device.

BACKGROUND

Electronic devices such as a mobile terminal, a dashboard camera, an action camera, and a drone platform are prone to shake in a shooting process, and cameras in the electronic devices also shake. Therefore, in these electronic devices, a motor or the like is usually configured for the camera as an actuator. The actuator drives, based on a shaking status of the electronic device, the camera to rotate reversely for resetting, to achieve an objective of image stabilization shooting.

In the foregoing electronic device, the camera is connected to a flexible circuit board, and the flexible circuit board is configured to electrically connect the camera to a mainboard. In a rotation process of the camera, the flexible circuit board is driven by the camera to be bent. However, because stress caused by a material characteristic of the flexible circuit board is difficult to overcome, resistance of the camera in the rotation process is large, the camera cannot be driven in place in time, and a stabilization effect is poor.

SUMMARY

This disclosure provides a camera assembly and an electronic device, to reduce resistance of a flexible circuit board connected to a camera that needs to be overcome when an actuator drives the camera to swing, and improve a stabilization effect of the camera.

According to a first aspect, a camera assembly is provided. The camera assembly is used in an electronic device, and is configured to capture an image. The electronic device may be an electronic device that easily shakes when being used and that has an image capture function, for example, a mobile terminal, a dashboard camera, an action camera, or a drone platform. To reduce resistance of a flexible circuit board connected to a camera that needs to be overcome when an actuator drives the camera to swing, and improve a stabilization effect of the camera, the camera assembly includes the camera and the flexible circuit board. The camera can swing around at least one of a first axis, a second axis, and a third axis, where the third axis is used as an optical axis of the camera. In addition, in an extension direction of the flexible circuit board, one end of the flexible circuit board is connected to a circuit board in the camera, and the other end of the flexible circuit board is fastened and electrically connected to a mainboard, to implement an electrical connection between the circuit board in the camera and the mainboard. There is a bent redundant structure for releasing stress between the two ends of the flexible circuit board, and the redundant structure can extend in a direction of rotation around at least one of the first axis, the second axis, or the third axis. When the camera is driven by the actuator, the circuit board of the camera drives the flexible circuit board to swing and deform. Deformation is distributed to each cross section in the extension direction of the flexible circuit board, and a deformation accumulation at each cross section is small. When the actuator drives the camera to swing, only small material stress of the flexible circuit board needs to be overcome, so that the camera can be adjusted in time based on a reset angle that needs to be adjusted, and a stabilization effect during shooting is improved.

The redundant structure may be formed in a plurality of manners. For example, a specific implementation of the redundant structure is that the redundant structure includes a spiral section. The spiral section is an elastic structure. After stress generated when one end of the flexible circuit board is driven by the camera to deform is released to the spiral section, the stress can be fully absorbed by the spiral section. In addition, when the spiral section has a specific volume, a length of the spiral section is long. After deformation is distributed on the spiral section, a deformation accumulation at each cross section is small. This helps reduce the resistance of the flexible circuit board that needs to be overcome when the actuator drives the camera.

In a specific implementation, the redundant structure further includes a lead-out section. One of two ends of the lead-out section is connected to the circuit board in the camera, and the other end of the lead-out section is connected to the spiral section. The lead-out section may execute a buffer function between the circuit board of the camera and the spiral section in advance.

When an extension direction of the lead-out section is set, in a specific implementation, the lead-out section may extend in a direction of the first axis. In comparison with a case in which the lead-out section extends away from the first axis, when the camera swings around the first axis, deformation of the lead-out section is smaller. Similarly, the lead-out section may alternatively extend in a direction of the second axis.

When a direction of the spiral section is specifically set, and the lead-out section extends in the direction of the first axis or the second axis, the spiral section can extend spirally around a central axis of the lead-out section. When the camera swings around the first axis and the second axis, the spiral section is not easy to twist, and generated material stress is smaller.

In another specific embodiment, the redundant structure may be formed in the following manner. The camera includes a panel, a backplane, and a surrounding wall. The panel and the backplane are arranged in a direction of the third axis and disposed opposite to each other. The surrounding wall connects the panel to the backplane. The redundant structure includes a winding section wound along at least a part of the surrounding wall. When the camera swings around the third axis, the winding section is repeatedly tightened and loosened, so that stress generated by deformation of each part in the flexible circuit board can be absorbed by using an elastic structure of the winding section. In addition, the winding section is disposed along the surrounding wall, and does not occupy additional external space.

In another specific embodiment, the redundant structure further includes a lead-out section. One end of the lead-out section is connected to the circuit board in the camera, and the other end of the lead-out section is connected to the winding section. The lead-out section may execute a buffer function between the circuit board of the camera and the winding section in advance.

In a specific embodiment, the camera assembly further includes an enclosure. The enclosure is disposed around the surrounding wall, and a gap exists between the enclosure and the surrounding wall. The winding section is located in the gap between the surrounding wall and the enclosure, to avoid physical damage to the winding section caused by an external object.

In a specific embodiment, the redundant structure further includes an extension section. In an extension direction of the winding section, a side of one end that is of the winding section and that is far away from the circuit board of the camera is connected to one end of the extension section. When the camera swings around the first axis or the second axis, deformation of a joint between the extension section and the winding section is accumulated in a thickness direction, and a deformation accumulation is small. The other end of the extension section extends out of the enclosure, so that the winding section can be electrically connected to the mainboard.

Another specific implementation of the redundant structure is that the redundant structure includes a snake-shaped bent section. The snake-shaped bent section includes a plurality of sub-sections that are successively opposite to each other and disposed in parallel. One end of each sub-section located between two sub-sections is connected to a corresponding end of a sub-section on one side through a bent connecting part, and the other end of the sub-section is connected to a corresponding end of a sub-section on the other side through a bent connecting part. The snake-shaped bent section is an elastic structure. Stress generated when one end of the flexible circuit board is driven by the camera to deform can be fully absorbed by the snake-shaped bent section after the stress is released to the snake-shaped bent section. In addition, the snake-shaped bent section has a small volume, and a length of the snake-shaped bent section is long in an extension direction. After deformation is distributed on the snake-shaped bent section, a deformation accumulation at each cross section is small. This helps reduce the resistance of the flexible circuit board that needs to be overcome when the actuator drives the camera.

In another specific embodiment, the redundant structure further includes a lead-out section. One end of the lead-out section is connected to the circuit board in the camera, and the other end of the lead-out section is connected to the snake-shaped bent section. The lead-out section may execute a buffer function between the circuit board of the camera and the snake-shaped bent section in advance. A specific implementation of the lead-out section is that a gap extending in an extension direction of the lead-out section is disposed in a middle part of the lead-out section. When the lead-out section is twisted around the extension direction of the lead-out section, stress generated through twist may be released at the gap.

In another specific embodiment, the lead-out section extends in the direction of the first axis or the second axis. In comparison with a case in which the lead-out section extends away from the first axis, when the camera swings around the first axis, deformation of the lead-out section is smaller. Similarly, the lead-out section may alternatively extend in the direction of the second axis.

Each sub-section of the snake-shaped bent section may extend in a plurality of directions. For example, in a specific embodiment, an extension direction of each sub-section of the snake-shaped bent section is parallel to the extension direction of the lead-out section. When the lead-out section drives the snake-shaped bent section to swing, deformation of each sub-section of the snake-shaped bent section is mainly accumulated in a thickness direction, and a deformation accumulation is small.

In another specific embodiment, in at least a part of the sub-sections, a gap extending in an extension direction of each sub-section is disposed in a middle part of the sub-section. When each sub-section is twisted around a central axis of the sub-section, accumulated stress may be released at the gap.

Another specific fitting manner of the snake-shaped bent section and the lead-out section is that an extension direction of each sub-section of the snake-shaped bent section is perpendicular to the extension direction of the lead-out section. When the lead-out section drives the snake-shaped bent section to swing, deformation of each sub-section of the snake-shaped bent section is mainly accumulated in a thickness direction, and a deformation accumulation is small.

In a specific implementation, every two adjacent sub-sections are connected through a bent connecting part, and two bent connecting parts connecting each sub-section located between two sub-sections are located on two sides of a central axis of the sub-section, to increase the length of the snake-shaped bent section in the extension direction. In this way, the deformation accumulation on each cross section becomes smaller.

In another specific implementation, each bent connecting part extends along a side in an extension direction of an adjacent sub-section. When two adjacent sub-sections swing around an axis parallel to extension directions of the two sub-sections, deformation of the bent connecting part is mainly accumulated in a thickness direction, and a deformation accumulation is small.

According to a second aspect, an electronic device is provided. The electronic device includes a mainboard and the camera assembly provided in the foregoing technical solutions. In the extension direction of the flexible circuit board, an end that is of the flexible circuit board and that is away from the circuit board in the camera is electrically connected to the mainboard, to implement an electrical connection between the mainboard and the circuit board in the camera.

The foregoing camera assembly is used in the electronic device. Therefore, when the camera is used to capture an image in a shaking environment, and the camera swings around the at least one of the first axis, the second axis, and the third axis by using the redundant structure in the flexible circuit board, the material stress generated by the flexible circuit board is released in the redundant structure. In this way, the resistance caused when the actuator drives the camera is reduced, and a stabilization effect when the electronic device uses the camera to shoot is improved.

BRIEF DESCRIPTION OF DRAWINGS

FIG. 1b is a schematic diagram after assembly of the camera assembly shown in FIG. 1a;

DESCRIPTION OF EMBODIMENTS

To make objectives, technical solutions, and advantages of this disclosure clearer, the following further describes this disclosure in detail with reference to the accompanying drawings. In the following embodiments, the term "flexible circuit board" is any flexible board on which a circuit is formed, including but not limited to a flexible printed circuit (FPC) board.

To facilitate understanding of a camera assembly provided in embodiments of this disclosure, an application scenario of the camera assembly is first described. The camera assembly may be used in an electronic device that easily shakes when being used and that has an image capture function, for example, a mobile terminal, a dashboard camera, an action camera, and a drone platform. The mobile terminal is, for example, a mobile phone, a tablet computer, a bar code scanner, an RFID reader, or a POS terminal. The camera assembly is used in the foregoing electronic device to capture an image.

An embodiment of this disclosure provides a camera assembly.

Figure 1A:
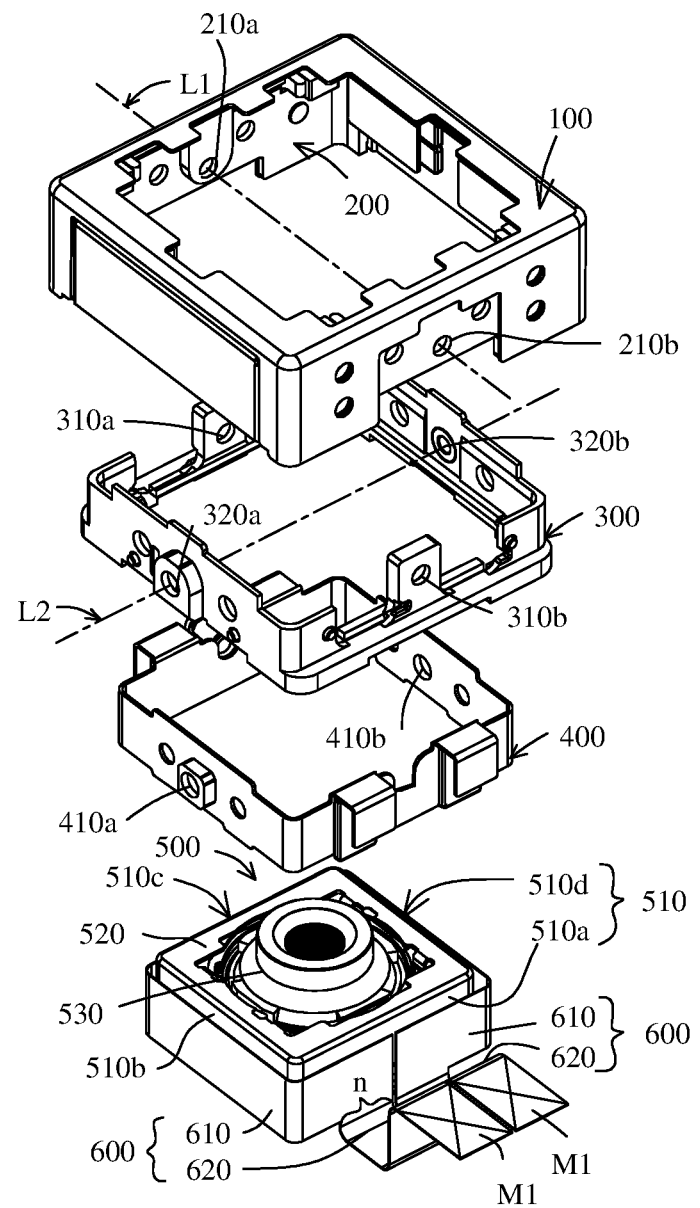
FIG. 1a is an exploded view of a camera assembly according to an embodiment of this disclosure.
Figure 1B:
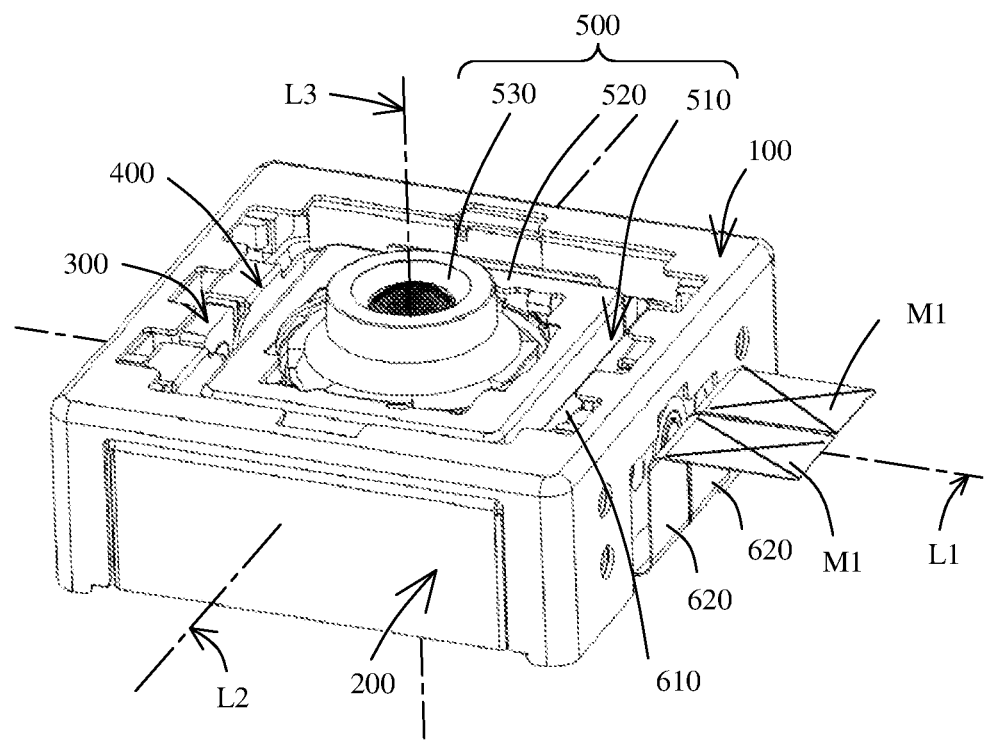
Figure 1C:
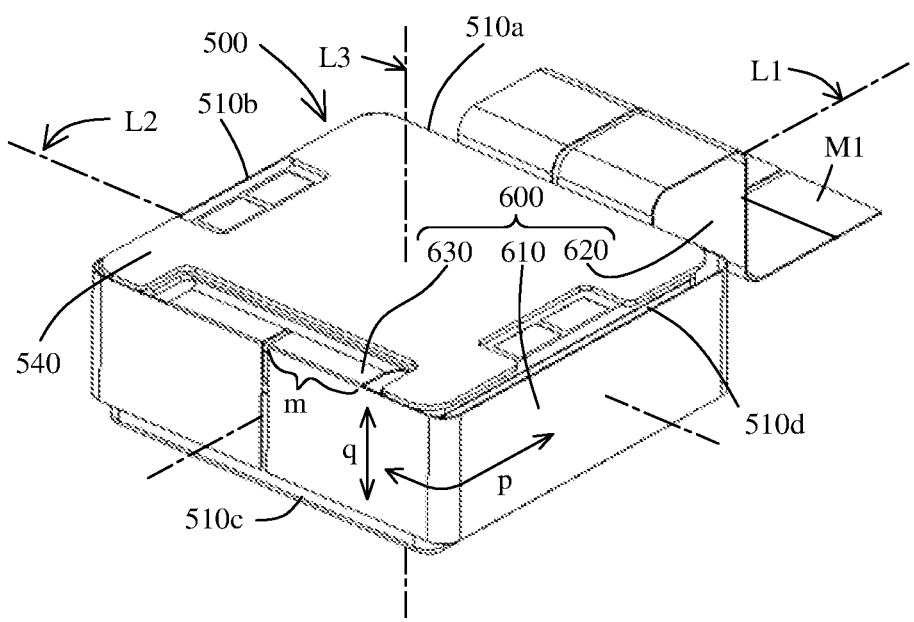
FIG. 1c is a schematic diagram of fitting of a camera and a flexible circuit board in the camera assembly shown in FIG. 1a and FIG. 1b.

For example, FIG. 1a is an exploded view of a camera assembly according to an embodiment of this disclosure, FIG. 1b is a schematic diagram after assembly of the camera assembly shown in FIG. 1a, and FIG. 1c is a schematic diagram of fitting of a camera 500 and a flexible circuit board 600 in the camera assembly shown in FIG. 1a and FIG. 1b. With reference to FIG. 1a, FIG. 1b, and FIG. 1c, the camera assembly provided in this embodiment of this disclosure includes a housing 100, a base 200, a first swing body 300, a second swing body 400, a camera 500, and a flexible circuit board 600. Each of the base 200, the first swing body 300, and the second swing body 400 has a surrounding wall structure (for example, in a form of a rectangular frame). The housing 100 is sleeved outside the base 200 and is fastened to the base 200. The base 200 is sleeved outside the first swing body 300. An axle hole 210a and an axle hole 210b are disposed in the middle of two parallel and opposite side frames of the base 200. An axle hole 310a and an axle hole 310b are disposed in the middle of two parallel and opposite side frames of the first swing body 300. The axle hole 210a fits the axle hole 310a through a rotating shaft, and the axle hole 210b fits the axle hole 310b through a rotating shaft, so that the first swing body 300 can swing around a first axis L1 relative to the base 200. The first swing body 300 is sleeved outside the second swing body 400. An axle hole 320a and an axle hole 320b are disposed on the other two parallel and opposite side frames of the first swing body 300. An axle hole 410a and an axle hole 410b are disposed on two parallel and opposite side frames of the second swing body 400. The axle hole 320a fits the axle hole 410a through a rotating shaft, and the axle hole 320b fits the axle hole 410b through a rotating shaft, so that the second swing body 400 can swing around a second axis L2 relative to the first swing body 300. The second axis L2 is perpendicular to the first axis L1. The camera 500 includes a housing, and the housing includes a panel 520, a backplane 540, and a surrounding wall 510 formed by four side walls (510a, 510b, 510c, and 510d). The panel 520 and the backplane 540 are arranged in a direction of a third axis L3 and disposed opposite to each other, and the third axis L3 is perpendicular to both the first axis L1 and the second axis L2. The surrounding wall 510 formed by the side walls (510a, 510b, 510c, and 510d) connects the panel 520 and the backplane 540, the side wall 510a and the side wall 510c are disposed opposite to each other, and the side wall 510b and the side wall 510d are disposed opposite to each other. The camera 500 further includes a lens 530, the lens 530 is disposed in the middle of the panel 520, and a lighting direction of the lens 530 is away from the backplane 540. The second swing body 400 is sleeved outside the four side walls (510a, 510b, 510c, and 510d) of the camera 500 (therefore, the second swing body 400 is also referred to as an enclosure, the so-called "enclosure" is an enclosure extending around the surrounding wall 510, and a form of the enclosure includes but is not limited to a structure of the second swing body 400). Four side frames of the second swing body 400 are disposed opposite to the side walls (510a, 510b, 510c, and 510d) of the camera 500 respectively. Spaced bumps are disposed on surfaces of the side walls (510a, 510b, 510c, or 510d), so that gaps are maintained between the side frames of the second swing body 400 and the side walls (510a, 510b, 510c, and 510d). In addition, the side walls (510a, 510b, 510c, and 510d) are fastened to the side frames of the second swing body 400 (for example, through clamping). In this way, based on shaking information detected by a sensor or the like, a control unit drives, by using an actuator such as a motor, the camera 500 to swing around the first axis L1 or the second axis L2 relative to the base 200, so that the camera 500 remains at an original spatial position as far as possible, to achieve an objective of image stabilization shooting. When the camera 500 swings around the first axis L1 or the second axis L2, the lens of the camera 500 keeps roughly facing a direction of the third axis L3. In this case, the third axis L3 is referred to as an optical axis of the camera 500. In some other cases, the actuator may be used to drive the camera 500 to swing around the third axis L3. The foregoing may be a common manner known in the art for implementing that the camera 500 can swing around a plurality of axes. In addition, another manner may be used to drive the camera 500 to swing around a plurality of axes, and details are not described herein.

Still refer to FIG. 1a to FIG. 1c. The camera 500 further includes a circuit board (the circuit board is not shown in FIG. 1c, and is marked as B) disposed on an inner side of the backplane 540, and the circuit board B is disposed parallel to the backplane 540. The camera assembly shown in FIG. 1a to FIG. 1c includes two flexible circuit boards 600. First, one of the flexible circuit boards 600 is used for description. The flexible circuit board 600 includes a lead-out section 630, a winding section 610, and an extension section 620. One end of the lead-out section 630 is connected to a fixed position N1 (not shown in the figure, and the fixed position N1 is also a part of the flexible circuit board 600). For example, the fixed position N1 is fastened to and electrically connected to a side of the circuit board B, and extends to the side wall 510c adjacent to the side of the circuit board B. The winding section 610 extends from a middle part of the side wall 510c to a middle part of the side wall 510a by passing the side wall 510d; the winding section 610 is located at a side m (refer to FIG. 1a, the side m extends in an extension direction of the winding section 610) of the side wall 510c and is connected to an end that is of the lead-out section 630 and that is away from the circuit board B; and the winding section 610 is located in a gap between a surrounding wall structure of the second swing body 400 and the surrounding wall 510 of the camera 500. One end of the extension section 620 is connected to a side n that is of the winding section 610, that is located on one end of the side wall 510a, and that is close to the backplane 540 (as shown in FIG. 1c, the side n extends in the extension direction of the winding section 610). In this way, the extension section 620 passes by the second swing body 400, the base 200, and the side frames of the housing 100 to the outside of the housing 100, the extension section 620 passes by the base 200 and the housing 100 and then extends for a distance in a direction roughly parallel to the side wall 510a, one end that is of the extension section 620 and that is away from the winding section 610 is fastened and electrically connected to a fixed position M1, and the fixed position M1 is fastened to a mainboard of the electronic device. For example, the fixed position M1 may be directly fastened to the mainboard through an edge connector. Alternatively, the fixed position M1 is first fastened to a package housing outside the housing 100, and is fastened to an interface of a connector fastened on the package housing; and the other interface of the connector is fastened to the mainboard. Similarly, the fixed position N1 may also be fastened to the circuit board B in a similar manner, and finally, the circuit board B of the camera 500 is electrically connected to the mainboard of the electronic device through the flexible circuit board. The other flexible circuit board 600 has a same structure as the foregoing flexible circuit board 600, and the two flexible circuit boards 600 are symmetrical with respect to a mid-vertical plane of the side wall 510a, to fully use space of the gaps between the second swing body 400 and the side walls (510a, 510b, 510c, or 510d), so that the circuit board B has more lines that can be electrically connected to the external mainboard. It may be understood that only one of the flexible circuit boards 600 may be retained. It should be noted that the foregoing defined factors such as a relative position relationship and shapes are all for a flexible circuit board 600 that is not pulled when the flexible circuit board 600 is in a natural state.

In the camera assembly provided in the embodiment corresponding to FIG. 1a to FIG. 1c, for each flexible circuit board 600, when the camera 500 swings around the first axis L1 (relative to the mainboard of the electronic device):

The lead-out section 630 is twisted and deformed in a thickness direction. To be specific, in a direction of the second axis L2, one end of the lead-out section 630 is raised relative to the circuit board B, and the other end of the lead-out section 630 is lowered relative to the circuit board B. In addition, deformation of the lead-out section 630 caused by twist is transferred to the winding section 610. A length of the winding section 610 in an extension direction p of the winding section 610 is long, the generated deformation may be distributed to each part in the extension direction p of the winding section 610. Therefore, for each cross section in the extension direction p of the winding section 610, deformation is small, and stress generated due to the deformation is also small. In addition, the winding section 610 also transfers the deformation to the extension section 620; and in an extension direction p of the extension section 620, the deformation is distributed to each cross section of the extension section. Deformation of each cross section is small, and material stress of the flexible circuit board 600 that the actuator needs to overcome is small. In conclusion, the lead-out section 630, the winding section 610, and the extension section 620 are not fastened in extension directions, have a specific degree of deformation redundancy, and extend in a bent manner to form a bent redundant structure (the "redundant structure" should be understood as follows: an extension path of the redundant structure is non-linear, parts of two ends of the redundant structure are not fastened, and the redundant structure has a specific degree of deformation redundancy; and when the actuator drives the camera 500 to swing, deformation of each part of the flexible circuit board 600, including the redundant structure, may be distributed to each part of the redundant structure, and generated stress is released in the redundant structure). The stress generated by the deformation of the flexible circuit board 600 may be released in each part of the redundant structure, and stress that needs to be overcome when the actuator drives the camera 500 to swing around the first axis L1 is reduced. In addition, a function of the lead-out section 630 is as follows: If the side m of the flexible circuit board 600 is directly connected to the circuit board B, when the actuator drives the camera 500 to swing around the first axis L1, the circuit board B drives one end of the winding section 610 to twist and deform in a width direction q of the winding section 610, a deformation accumulation caused by twist in the width direction q of the winding section 610 is large, and stress that the actuator needs to overcome is also large. In addition, after being used for a long time period, the winding section 610 is easily torn. This affects stability of line signal transmission on the winding section 610. After the lead-out section 630 is disposed, when the actuator drives the camera 500 to swing around the first axis L1, deformation of the lead-out section 630 is mainly accumulated in a thickness direction, a deformation accumulation is small, and stress of the lead-out section 630 that needs to be overcome by the actuator is also small, to first release material stress. This is equivalent to implementing a "flexible" connection between the winding section 610 and the lead-out section 630. In addition, a function that the winding section 610 bends and extends along the side wall 510c, the side wall 510d, and the side wall 510a, instead of extending in a straight line direction is as follows: If the winding section 610 keeps extending in a length direction of the side wall 510c, when the actuator drives the camera 500 to swing around the first axis L1, most deformation of the winding section 610 is accumulated in the width direction q, and stress that needs to be overcome by the actuator is large. However, when the winding section 610 bends and extends along the side wall 510c, the side wall 510d, and the side wall 510a, if the actuator drives the camera 500 to swing around the first axis L1, deformation in the extension direction p occurs at a corner of the winding section 610. The deformation herein mainly focuses on the thickness direction of the winding section 610, and stress of the winding section 610 that needs to be overcome by the actuator is reduced. In addition, when the winding section 610 bends and extends along the side wall 510c, the side wall 510d, and the side wall 510a, external space of the camera assembly is saved.

When the actuator drives the camera 500 to swing around the second axis L2 (relative to the mainboard of the electronic device):

A connection end of the winding section 610 and the lead-out section 630 rotates around the side m of the winding section 610, deformation is mainly accumulated in a thickness direction at a joint of the winding section 610 and the lead-out section 630, and a deformation accumulation on a cross section is small. In addition, a bending part of the winding section 610 is twisted around an axis of the extension direction p of the winding section 610. Herein, the deformation on the cross section is mainly accumulated in the thickness direction, and the deformation accumulation is small. At least a part of stress generated by the deformation of the flexible circuit board 600 is released, and only small stress of the flexible circuit board 600 needs to be overcome when the actuator drives the camera 500 to swing around the second axis L2.

When the actuator drives the camera 500 to swing around the third axis L3 (relative to the mainboard of the electronic device):

Deformation of the flexible circuit board 600 is mainly reflected in that when the winding section 610 is tightened or loosened around the third axis L3, deformation of a cross section perpendicular to the extension direction p is accumulated in the thickness direction of the winding section 610, and a deformation accumulation is small. In addition, the foregoing deformation is distributed and released at each cross section in the extension direction of the winding section 610. Only small stress of the flexible circuit board 600 needs to be overcome when the actuator drives the camera 500 to swing around the third axis L3. To enable the winding section 610 to have specific space when being tightened, a specific gap may be reserved between the winding section 610 and a surface of the surrounding wall 510.

Through the foregoing disposition, when the actuator drives the camera 500 to swing around the first axis L1, the second axis L2, and the third axis L3, resistance to the stress from the flexible circuit board 600 that needs to be overcome is small, the camera 500 can arrive at a specified position in time when being driven by the actuator, and an image stabilization effect during shooting of the camera 500 is enhanced. In addition, the winding section 610 is hidden between the surrounding wall 510 and the second swing body 400, does not occupy additional external space, and does not scratch an object outside the housing 100 to cause damage to the winding section 610. In addition, the winding section 610 is an elastic structure, so that stress generated by another part of the flexible circuit board can be released at the winding section 610.

It should be noted that, based on the camera assembly shown in FIG. 1a to FIG. 1c, the winding section 610 may extend by half a circle around a circumference of the camera 500 along the surface of the surrounding wall 510, or extend by more than half a circle around the circumference of the camera 500, for example, by 0.5 to 3.5 circles, and specifically by any one of 0.5 circle, 1 circle, 1.5 circles, 2 circles, 2.5 circles, 3 circles, and 3.5 circles.

Figure 2A:
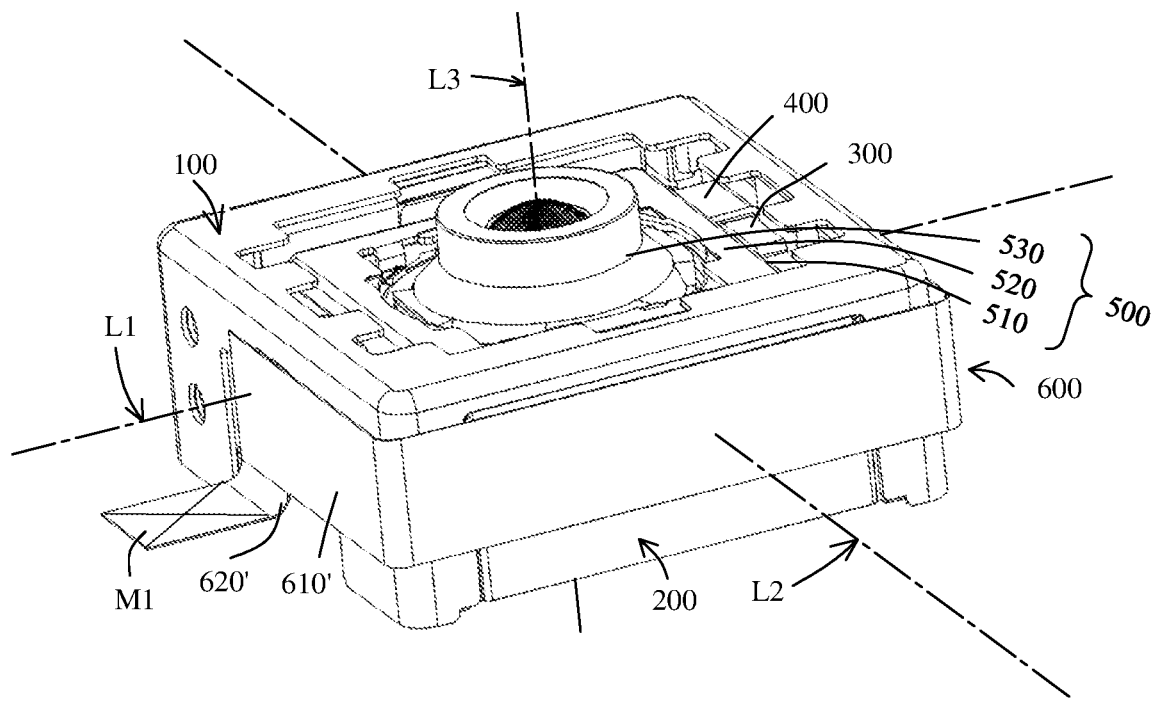
FIG. 2a is a three-dimensional diagram of another camera assembly from an angle of view according to an embodiment of this disclosure.
Figure 2B:
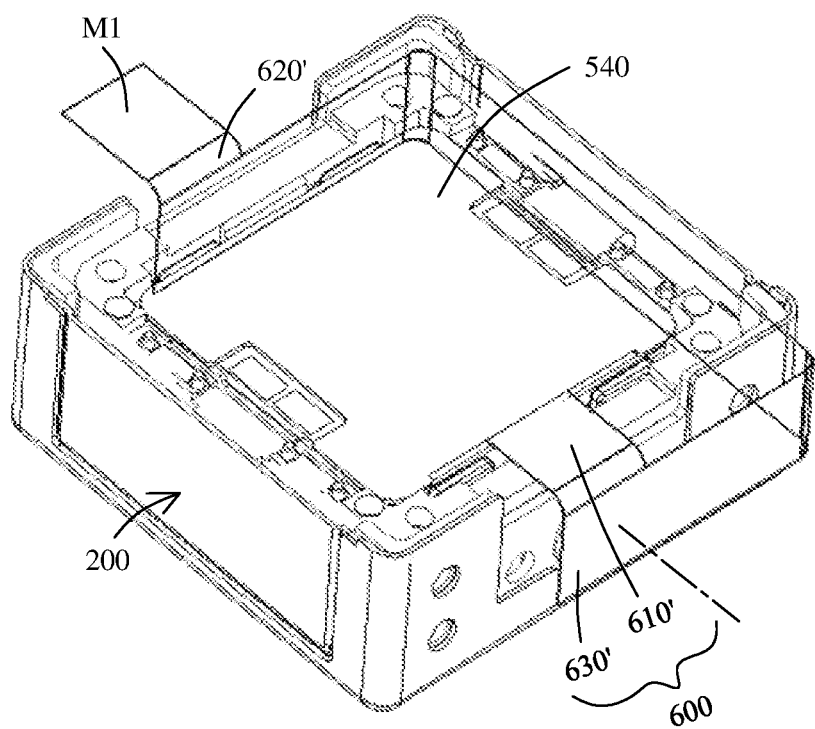
FIG. 2b is a three-dimensional diagram of the camera assembly shown in FIG. 2a from another angle of view.

For example, FIG. 2a is a three-dimensional diagram of another camera assembly from an angle of view according to an embodiment of this disclosure, and FIG. 2b is a three-dimensional diagram of the camera assembly shown in FIG. 2a from another angle of view. In FIG. 2b, to clearly show a track of the flexible circuit board 600, a blocked part of the flexible circuit board 600 is still displayed in a solid line. With reference to FIG. 2a and FIG. 2b, a difference between the camera assembly shown in FIG. 1a to FIG. 1c and the camera assembly shown in FIG. 2a and FIG. 2b lies in that: A winding section 610' (corresponding to the winding section in FIG. 1c) is disposed outside the housing 100 and extends around a circumferential surface of the housing 100 (in other words, extends around the third axis L3), instead of that the winding section 610 is disposed in the gap between the surrounding wall 510 of the camera 500 and the second swing body 400 in the camera assembly shown in FIG. 1a to FIG. 1c. When the actuator drives the camera 500 to swing around the first axis L1, the second axis L2, and the third axis L3, for a stress release principle of the flexible circuit board 600, refer to related principle explanation in the camera assembly shown in FIG. 1a to FIG. 1c. In addition, in FIG. 2a and FIG. 2b, a quantity of flexible circuit boards 600 is reduced to one. However, it should be understood that two symmetric flexible circuit boards 600 may alternatively be disposed with reference to FIG. 1a to FIG. 1c. Only a bent part that is of an extension section 620' and that is connected to the fixed position M1 and the winding section 610 is retained. However, it should be understood that the extension section 620' may alternatively be disposed in a form of the extension section 620 in FIG. 1a to FIG. 1c or in another form that can reduce stress. In addition, for other parameters, deformation, and the like of the flexible circuit board 600, refer to the embodiment corresponding to FIG. 1a to FIG. 1c.

Figure 3A:
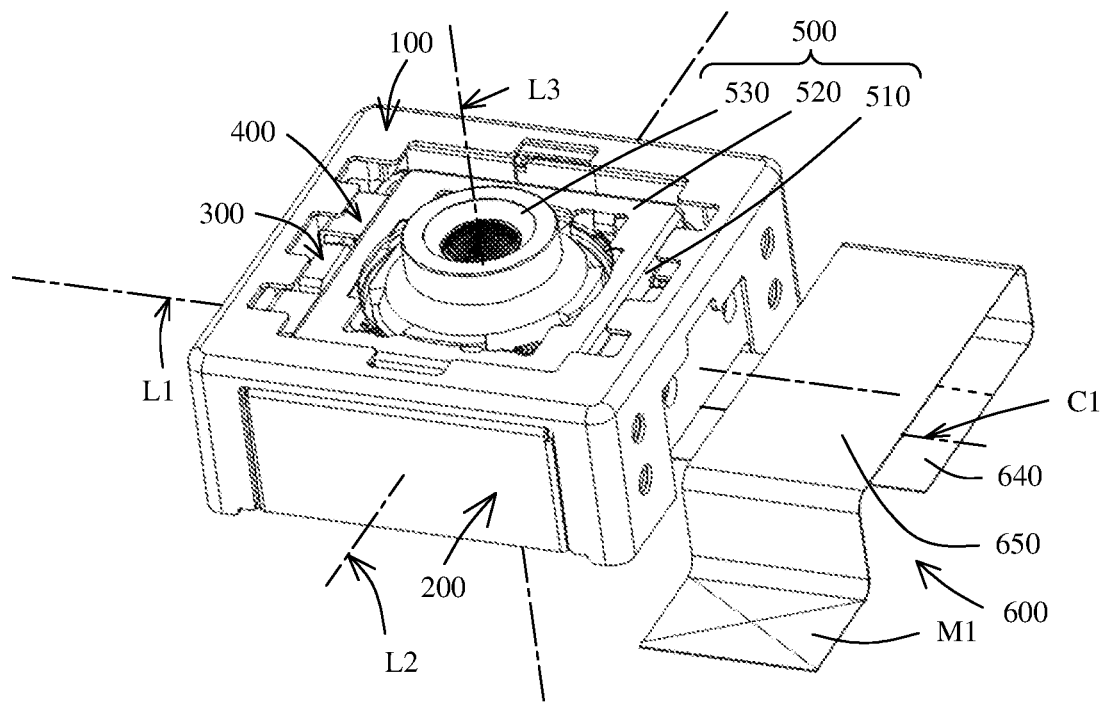
FIG. 3a is a three-dimensional diagram of another camera assembly from an angle of view according to an embodiment of this disclosure.
Figure 3B:
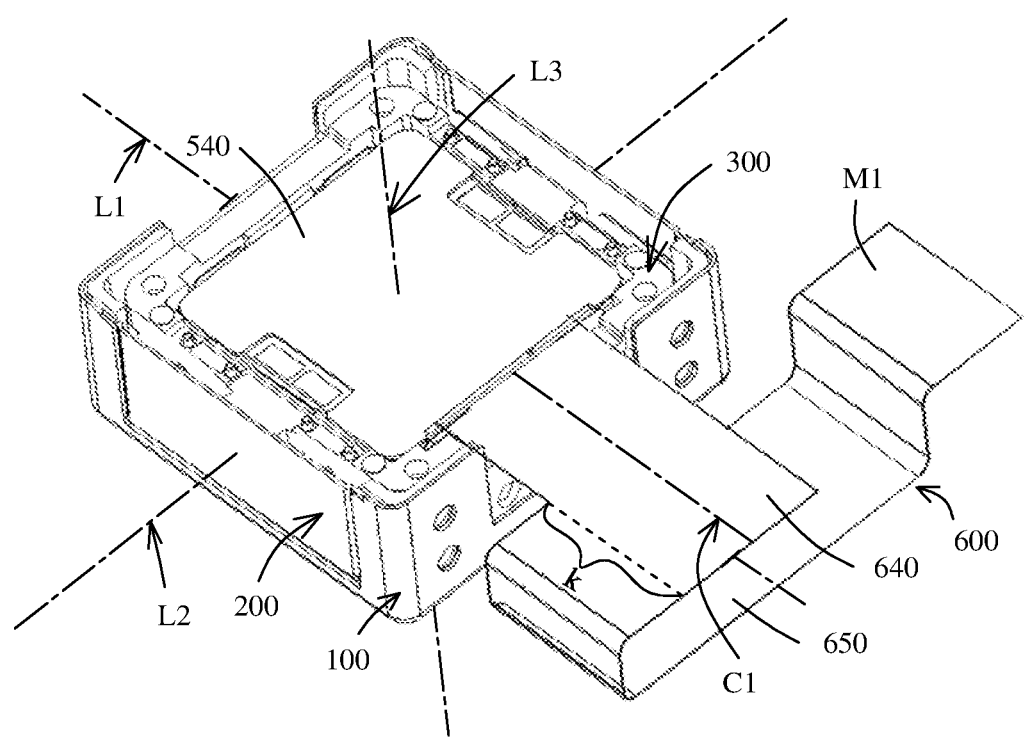
FIG. 3b is a three-dimensional diagram of the camera assembly shown in FIG. 3a from another angle of view.

For example, FIG. 3a is a three-dimensional diagram of another camera assembly from an angle of view according to an embodiment of this disclosure, and FIG. 3b is a three-dimensional diagram of the camera assembly shown in FIG. 3a from another angle of view. With reference to FIG. 3a and FIG. 3b, a difference between the camera assembly shown in FIG. 3a and FIGS. 3b and the camera assembly shown in FIG. 1a to FIG. 1c lies in that: The flexible circuit board 600 in the camera assembly includes a lead-out section 640 and a spiral section 650. One end of the lead-out section 640 is fastened to the fixed position N1 (not shown in the figure), and the fixed position N1 is connected to a side of one end in a direction of the first axis L1 of the circuit board B in the camera 500. In addition, the lead-out section 640 extends in the direction that is of the first axis L1 and that is away from the circuit board B (refer to FIG. 3b, an extension direction of the lead-out section 640 is an extension direction of a central axis C1 of the lead-out section 640, and the central axis C1 is, for example, parallel to the first axis L1). A start end of the spiral section 650 is connected to a side k that is of the lead-out section 640 and that is parallel to the central axis C1. In addition, the spiral section 650 spirally extends around the central axis C1 of the lead-out section 640 for about a half circle, and at least a part of a structure of the spiral section 650 surrounds the first axis L1. A tail end of the spiral section 650 is fastened to the fixed position M1, and the fixed position M1 is fastened to the mainboard in the electronic device, to implement an electrical connection between the circuit board B and the mainboard. The so-called "spiral section" is a section of a flexible circuit board extending around a spiral axis, and an outer surface of each part of the flexible circuit board is parallel (or approximately parallel) to the spiral axis. The so-called "spiral extension" is extension around the spiral axis.

In the camera assembly provided in the embodiment corresponding to FIG. 3a and FIG. 3b, when the actuator drives the camera 500 to swing around the first axis L1:

When the lead-out section 640 is twisted by the circuit board B to rotate, the lead-out section 640 is twisted and deformed through the central axis C1 as an axis. Because the side k of the lead-out section 640 is connected to the start end of the spiral section 650, and the spiral section 650 spirals around the central axis C1, stress accumulated by the lead-out section 640 caused by twist and deformation is released to the spiral section 650, and the spiral section 650 is tightened or loosened. Deformation of a cross section of the spiral section 650 is mainly accumulated in a thickness direction, a length of the spiral section 650 is long, deformation is distributed in an extension direction of the spiral section 650, and a deformation accumulation at a single cross section of the spiral section 650 is small. Therefore, when the actuator drives the camera 500 to rotate around the first axis L1, the lead-out section 640 only needs to overcome small stress of the flexible circuit board 600. In addition, the twist and the deformation generated when the lead-out section 640 extends along the first axis L1 is smaller than that generated when the lead-out section 640 extends in a direction deviating from the first axis L1. In addition, because the spiral section 650 extends around the central axis C1 of the lead-out section 640, the spiral section 650 is not likely to twist around an axis of the extension direction of the spiral section 650.

When the actuator drives the camera 500 to swing around the second axis L2:

On one hand, one end that is of the lead-out section 640 and that is close to the circuit board B swings under driving of the circuit board B, so that the lead-out section 640 repeatedly bends around an axis perpendicular to the central axis C1, and deformation of the cross section of the lead-out section 640 is mainly accumulated in the thickness direction. On the other side, one end that is of the lead-out section 640 and that is away from the circuit board B drives the start end of the spiral section 650 to swing together, and deformation caused by a swing is transferred in the extension direction of the spiral section 650, so that the deformation is distributed to each cross section in the extension direction of the spiral section 650. In addition, the deformation of the cross section of the spiral section 650 is also accumulated in the thickness direction, and a deformation accumulation on the cross section is small. When the actuator drives the camera 500 to rotate around the second axis L2, the lead-out section 640 only needs to overcome small stress of the flexible circuit board 600. In addition, because the spiral section 650 extends around the central axis C1 of the lead-out section 640, the spiral section 650 is not likely to twist around the axis of the extension direction of the spiral section 650.

When the actuator drives the camera 500 to swing around the third axis L3:

The lead-out section 640 drives the start end of the spiral section 650 to swing around the third axis L3, the start end of the spiral section 650 moves with remaining parts of the spiral section 650, deformation of the start end of the spiral section 650 is distributed to the remaining parts of the spiral section 650, and deformation on a single cross-sectional area of the spiral section 650 is small. When the actuator drives the camera 500 to rotate around the third axis L3, the lead-out section 640 only needs to overcome small stress of the flexible circuit board 600.

In conclusion, the spiral section 650 and the lead-out section 640 jointly form the bent redundant structure, so that the deformation generated by the flexible circuit board 600 is distributed to each cross section, the resistance caused when the actuator drives the camera 500 is reduced, and an image stabilization shooting effect is improved. The spiral section 650 is an elastic structure. The stress generated when the lead-out section 640 is driven by the camera 500 and deformed may be fully absorbed by the spiral section. In addition, the spiral section has the long extension length when having the small volume. After the deformation is distributed on the spiral section 650, the deformation accumulation at each cross section is small. This helps reduce the resistance of the flexible circuit board 600 that needs to be overcome when the actuator drives the camera 500.

Figure 4A:
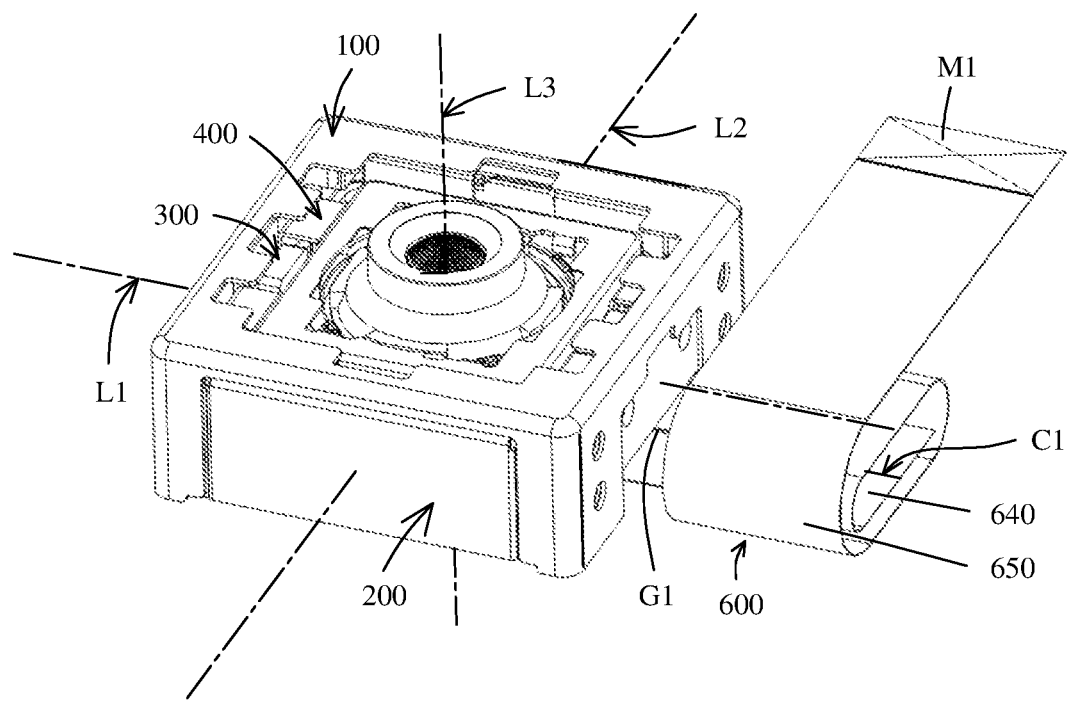
FIG. 4a is a three-dimensional diagram of another camera assembly according to an embodiment of this disclosure.
Figure 4B:
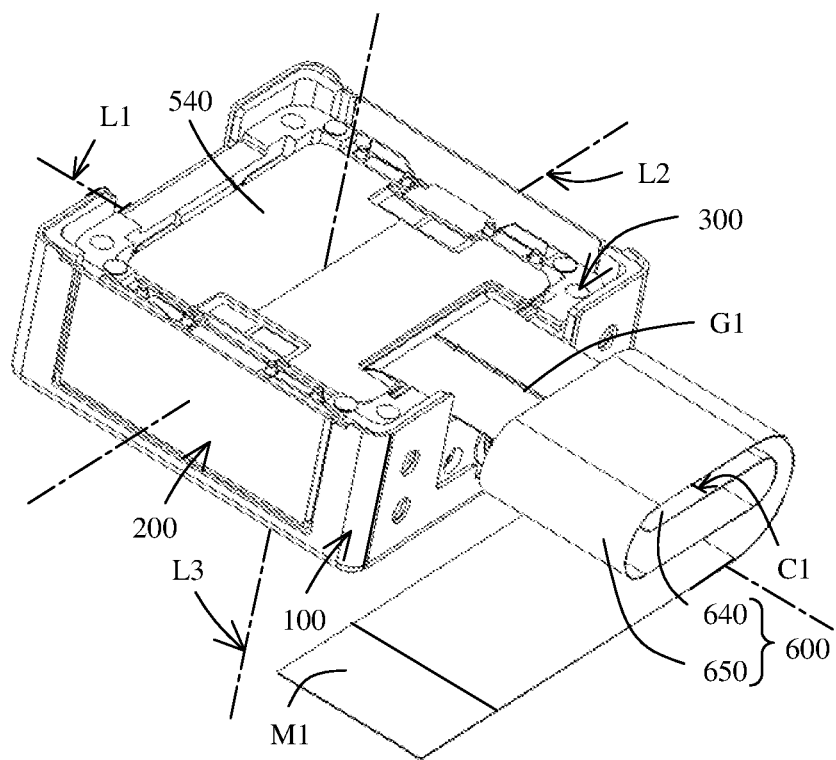
FIG. 4b is a three-dimensional diagram of the camera assembly shown in FIG. 4a from another angle of view.

It should be noted that, that the spiral section 650 spirally extends around the central axis C1 of the lead-out section 640 by about a half circle is merely an example for description. For example, FIG. 4a is a deformed structure of the camera assembly shown in FIG. 3a and FIG. 3b, and FIG. 4b is a three-dimensional diagram of the camera assembly shown in FIG. 4a from another angle of view. Refer to FIG. 4a and FIG. 4b. A difference between the camera assembly shown in FIG. 4a and FIG. 4b and the camera assembly shown in FIG. 3a and FIG. 3b lies in that: The spiral section 650 spirally extends around the central axis C1 of the lead-out section 640 for more than one circle, to further extend the length of the spiral section 650, so that deformation generated by the lead-out section 640 is distributed to each cross section of the spiral section 650 and becomes smaller. For example, a quantity of circles that the spiral section 650 spirally extends around the central axis C1 of the lead-out section 640 may be within a range of 0.5 circle to 4 circles, and may be specifically any one of 0.5 circle, 1 circle, 1.5 circles, 2 circles, 2.5 circles, 3 circles, 4 circles, and the like. In addition, a gap G1 may be further disposed on the lead-out section 640 along the central axis C1 of the lead-out section 640, so that when the camera 500 swings around the first axis L1, stress originally generated when the lead-out section 640 is twisted and deformed around the central axis C1 may be released at the gap G1, and the stress that needs to be overcome when the actuator drives the camera to swing around the first axis L1 is smaller. However, the gap G1 is not necessarily located at the central axis L1 as long as the gap G1 is disposed in a middle part of the lead-out section 640. The "middle part" includes a middle axis and areas near left and right sides of the middle axis, and the gap G1 is parallel to the central axis C1 ("parallel" may mean roughly parallel, for example, an included angle is less than or equal to 25°; or completely parallel, in other words, an included angle is equal to 0°). In addition, in FIG. 3a to FIG. 4b, in a natural state, the lead-out section 640 is parallel to a surface of the backplane 540. However, this is merely an example. The lead-out section 640 may also be bent to some extent around an axis parallel to the second axis L2. In addition, that the central axis C1 is parallel to the first axis L1 is merely an example. For example, an included angle (for example, less than or equal to 30°) may be formed between the central axis C1 and the first axis L1.

Figure 5A:
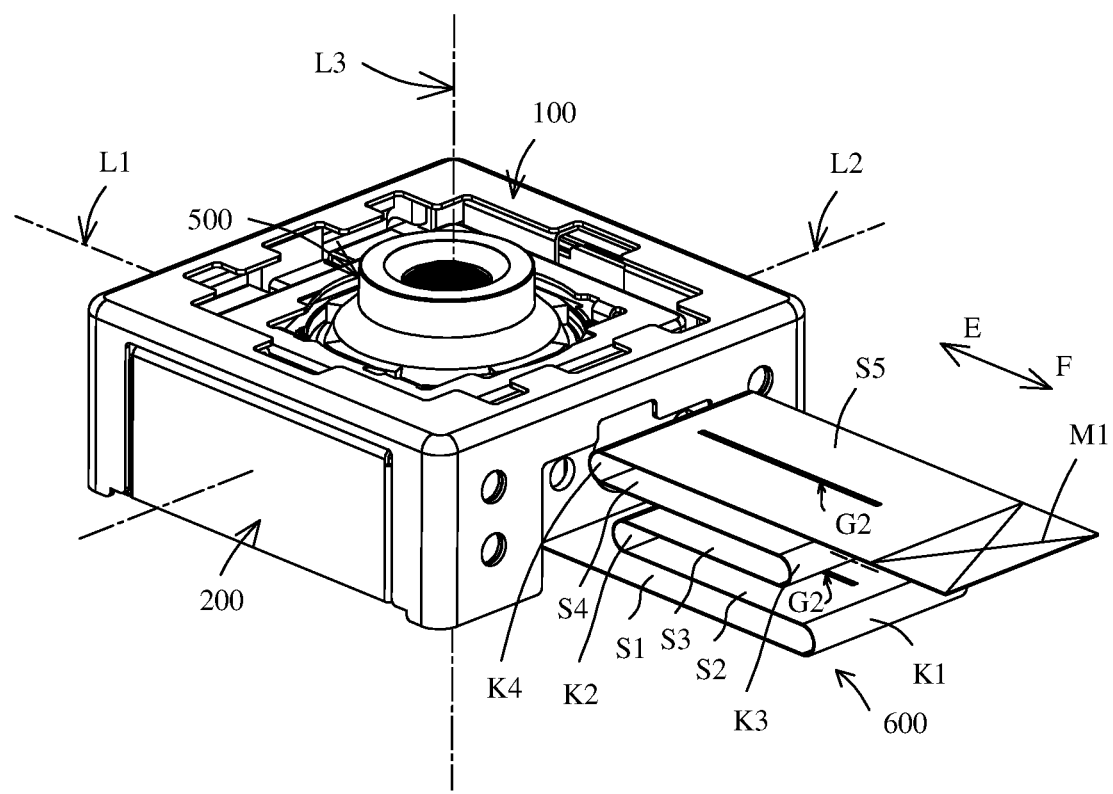
FIG. 5a is a three-dimensional diagram of another camera assembly from an angle of view according to an embodiment of this disclosure.
Figure 5B:
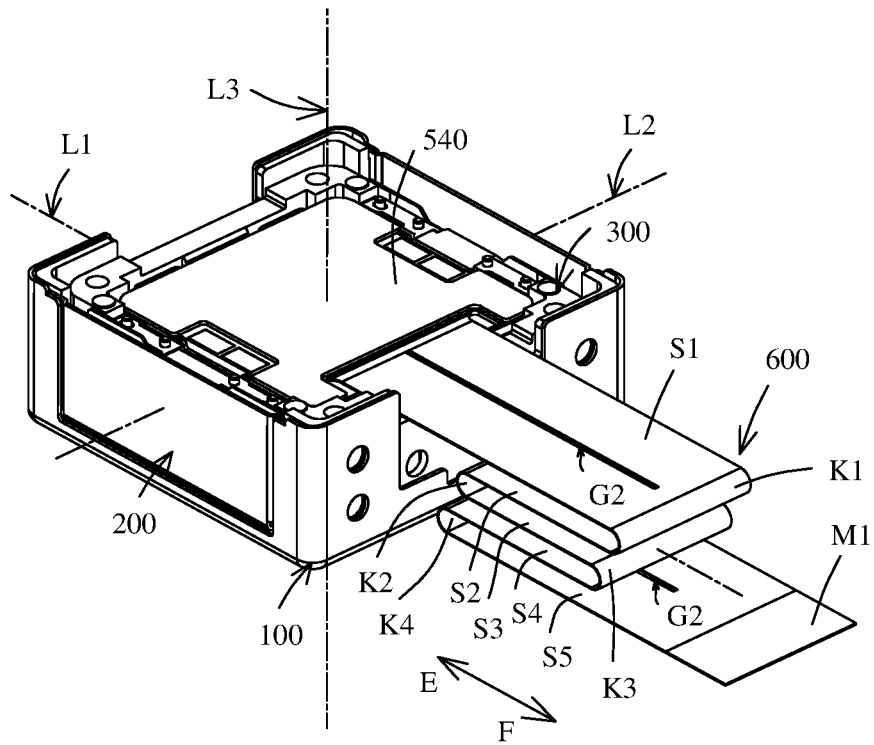
FIG. 5b is a three-dimensional diagram of the camera assembly shown in FIG. 5a from another angle of view.

For example, FIG. 5a is a three-dimensional diagram of another camera assembly from an angle of view according to an embodiment of this disclosure, and FIG. 5b is a three-dimensional diagram of the camera assembly shown in FIG. 5a from another angle of view. Both an E direction and an F direction are parallel to the first axis L1, and the E direction and the F direction are opposite to each other. A difference between the camera assembly shown in FIG. 5a and FIG. 5b and the camera assembly shown in FIG. 1a to FIG. 1c lies in that: The flexible circuit board 600 includes a lead-out section S1 and a plurality of sub-sections (S2, S3, S4, and S5) that are sequentially parallel and disposed opposite to each other. For example, the lead-out section S1 and each sub-section are parallel to the first axis L1 and the second axis L2, and an extension direction of the lead-out section S1 (namely, a direction of a central axis of the lead-out section S1. For a position of the central axis of the lead-out section S1, refer to a position of a gap G2 on the lead-out section S1 in FIG. 5a and FIG. 5b) and an extension direction of each sub-section (namely, a direction of a central axis of the sub-section. For a position of the central axis, refer to a position of a gap G2 in each sub-section in FIG. 5a and FIG. 5b) are the same (for example, the direction is parallel to the first axis L1). One end of the lead-out section S1 in the E direction is fastened to the fixed position N1 (not shown in the figure), the fixed position N1 is fastened and electrically connected to the circuit board B of the camera 500, one end of the lead-out section S1 in the F direction is connected to one end of the sub-section S2 in the F direction through a bent connecting part K1, one end of the sub-section S2 in the E direction is connected to one end of the sub-section S3 in the E direction through a bent connecting part K2, one end of the sub-section S3 in the F direction is connected to one end of the sub-section S4 in the F direction through a bent connecting part K3, and one end of the sub-section S4 in the E direction is connected to one end of the sub-section S5 in the E direction through a bent connecting part K4, so that the sub-sections (S2, S3, S4, and S5) are connected to form a snake-shaped bent section. In addition, the snake-shaped bent section and the lead-out section S1 form at least a part of the redundant structure. The redundant structure extends in a direction of rotation around the second axis L2 as a whole. One end of the sub-section S5 in the F direction is fastened to the fixed position M1, and the fixed position M1 is fastened and electrically connected to the mainboard of the electronic device, to implement the electrical connection between the circuit board B and the mainboard. The gap G2 is further disposed along the central axis of each sub-section of each flexible circuit board 600.

In the camera assembly provided in the embodiment corresponding to FIG. 5a and FIG. 5b, when the camera 500 swings around the first axis L1 (relative to the mainboard of the electronic device):

The lead-out section S1 is driven by the circuit board B to twist around the central axis of the lead-out section S1, and the lead-out section S1 sequentially transfers deformation caused by twist to the sub-sections (S2, S3, S4, and S5) of the lead-out section S1. After the twisted deformation of the lead-out section S1 is distributed to other sub-sections, deformation of each cross section in the extension direction of the flexible circuit board 600 is small. In FIG. 5a and FIG. 5b, the extension direction of the flexible circuit board 600 may be understood as successively extending in the extension direction of the lead-out section S1 and the sub-sections (S2, S3, S4, and S5). In addition, because the gaps G2 are disposed at the central axis of the lead-out section S1 and the central axes of the sub-sections (S2, S3, S4, and S5), when the lead-out section S1 and each layer of the sub-sections are twisted, stress can be released at the gaps G2. However, it should be noted that the gap G2 is not necessarily completely located at the central axis of the lead-out section S1, and a function of releasing stress can be achieved as long as the gap G2 is located in a middle part of the lead-out section S1. The so-called "middle part" includes the central axis of the lead-out section S1 and areas near to left and right sides of the central axis. Therefore, when the actuator drives the camera 500 to rotate around the first axis L1, the lead-out section 640 only needs to overcome small stress of the flexible circuit board 600.

When the camera 500 swings around the second axis L2 (relative to the mainboard of the electronic device):

The circuit board B of the camera 500 drives the lead-out section S1 to swing in a wave manner, and the lead-out section S1 transfers the swing to other sub-sections (S2, S3, S4, and S5), to release material stress generated due to the swing. In addition, in the extension direction of each layer of the sub-sections, the deformation accumulation at each cross section mainly focuses on the thickness direction, and the deformation accumulation at the cross section is small. Therefore, when the actuator drives the camera 500 to rotate around the second axis L2, the lead-out section 640 only needs to overcome small stress of the flexible circuit board 600.

When the camera 500 swings around the third axis L3 (relative to the mainboard of the electronic device):

The circuit board B drives the lead-out section S1 to swing around the third axis L3, and the lead-out section S1 transfers a swing to the sub-sections (S2, S3, S4, and S5). Because a length of the lead-out section S1 is increased after the lead-out section S1 is connected to the sub-sections, when deformation caused by the swing is distributed to the cross sections, deformation of each cross section is small. Therefore, when the actuator drives the camera 500 to rotate around the third axis L3, the actuator only needs to overcome small stress of the flexible circuit board 600.

In conclusion, the snake-shaped bent section formed by (S2, S3, S4, and S5) and the lead-out section S1 jointly form at least a part of the bent redundant structure in the flexible circuit board 600. When the lead-out section S1 deforms under driving of the circuit board B, the foregoing deformation is transferred to the snake-shaped bent section, to reduce the deformation of each cross section of each flexible circuit board 600, and reduce the resistance caused when the actuator drives the camera 500 to swing. The snake-shaped bent section is an elastic structure. Stress generated when one end of the flexible circuit board 600 is driven by the camera 500 to deform may be fully absorbed by the snake-shaped bent section after being released to the snake-shaped bent section. In addition, the snake-shaped bent section has a small volume, and the length of the snake-shaped bent section is long in the extension direction. After deformation is distributed on the snake-shaped bent section, a deformation accumulation at each cross section is small. This helps reduce the resistance of the flexible circuit board 600 that needs to be overcome when the actuator drives the camera 500.

It should be noted that the gap G2 on each sub-section may not be set, or may not be set at a central axis of a corresponding sub-section, as long as the gap G2 is parallel to the central axis of the corresponding sub-section ("parallel" may be completely parallel or approximately parallel). The gap G2 on the lead-out section S1 is similarly disposed. The lead-out section S1 and the central axis of each layer of sub-section may not be parallel to the first axis L1. The snake-shaped bent section in the camera assembly shown in FIG. 5a and FIG. 5b represents only four sub-sections. This is merely an example for description. A definition of the so-called "snake-shaped bent section" is as follows: The snake-shaped bent section includes a plurality of sub-sections that are successively opposite to each other and that are parallel (parallel may be approximately parallel, for example, an included angle is less than or equal to 25°; or may be completely parallel, in other words, an included angle is 0°). One end of each sub-section (for example, S3) located between two sub-sections (for example, S2 and S4) is connected to a corresponding end of a sub-section (for example, S2) on one side through a bent connecting part (for example, K1), and the other end of the sub-section is connected to a corresponding end of a sub-section (for example, S4) on the other side through a bent connecting part (for example, K3).

Figure 6A:
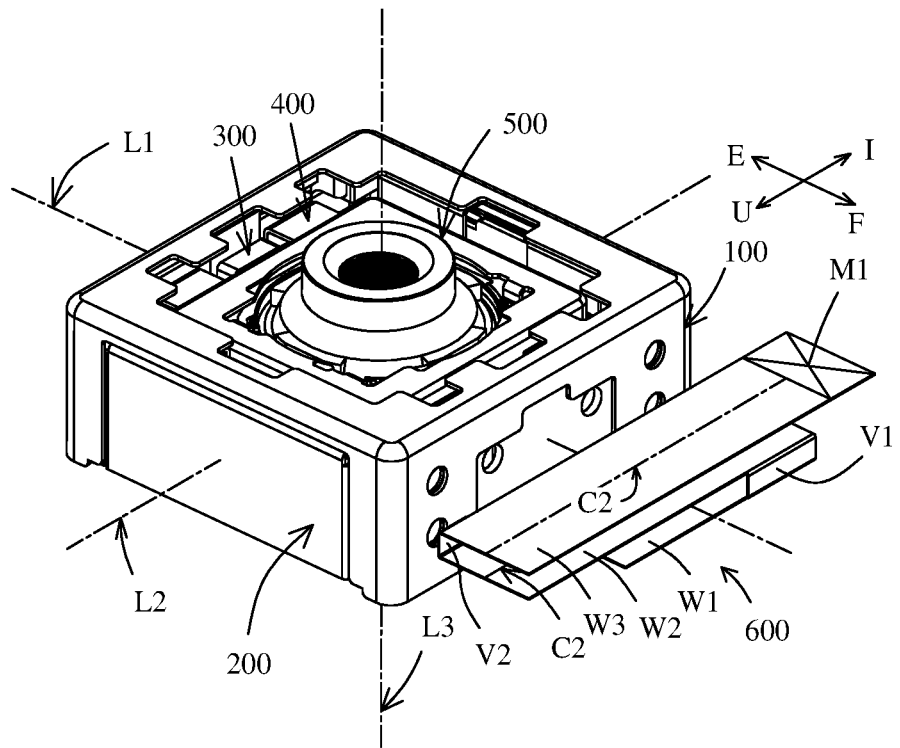
FIG. 6a is a three-dimensional diagram of another camera assembly from an angle of view according to an embodiment of this disclosure.
Figure 6B:
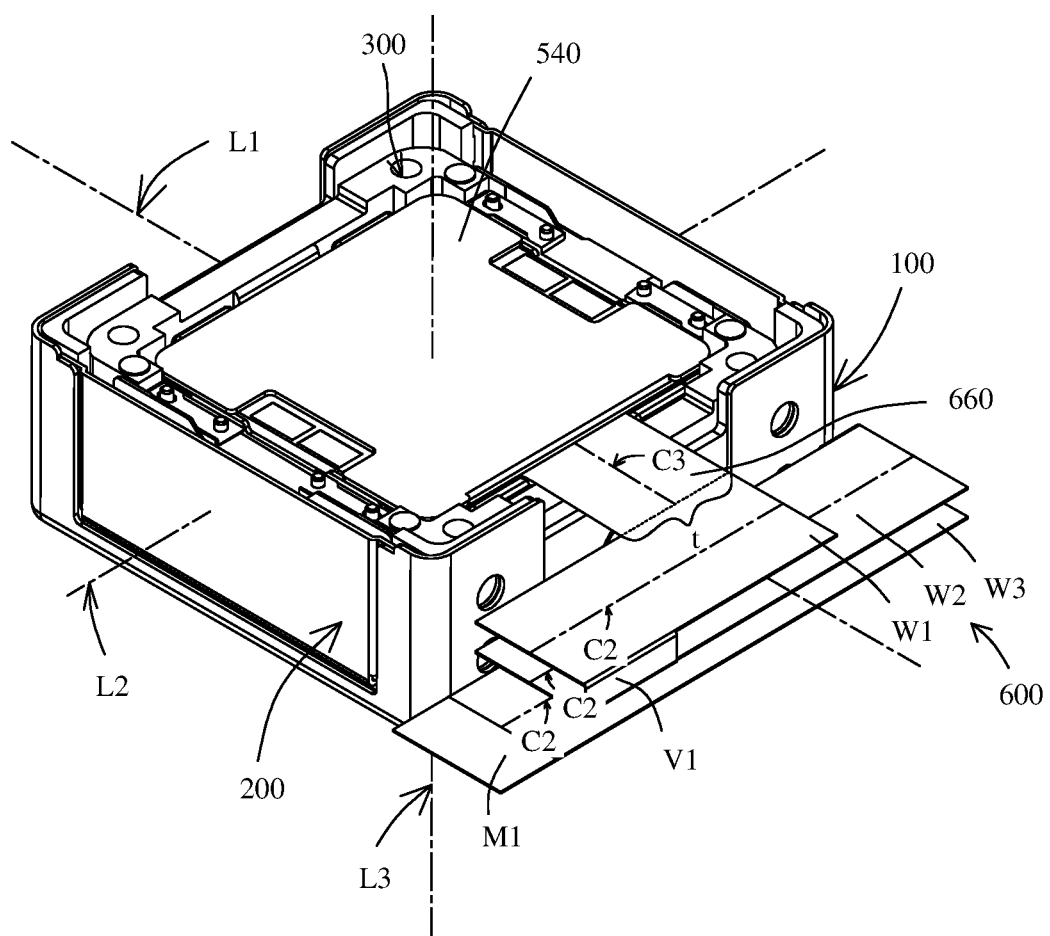
FIG. 6b is a three-dimensional diagram of the camera assembly shown in FIG. 6a from another angle of view.

For example, FIG. 6a is a three-dimensional diagram of another camera assembly from an angle of view according to an embodiment of this disclosure, and FIG. 6b is a three-dimensional diagram of the camera assembly shown in FIG. 6a from another angle of view. Both a U direction and a I direction are parallel to the second axis L2, and the U direction and the V direction are opposite to each other. Both the E direction and the F direction are parallel to the first axis L1, and the E direction and the F direction are opposite to each other. A difference between the camera assembly shown in FIG. 6a and FIG. 6b and the camera assembly shown in FIG. 1a to FIG. 1c lies in that: The flexible circuit board 600 includes a lead-out section 660, a plurality of sub-sections (W1, W2, and W3) that are sequentially parallel and disposed opposite to each other, and bent connecting parts (V1 and V2). For example, the sub-sections (W1, W2 and W3) are parallel to the first axis L1 and the second axis L2, and are spaced in the direction of the third axis L3. For example, a central axis C2 of each sub-section is parallel to the second axis L2. A side in the F direction at one end in the I direction of the sub-section W1 is connected to a side in the F direction at one end in the I direction of the sub-section W2 through the bent connecting part V1. A side in the E direction at one end in the U direction of the sub-section W2 is connected to a side in the E direction at one end in the U direction of the sub-section W3 through the bent connecting part V2, and the other end of the sub-section W3 is fastened to the fixed position M1. The fixed position M1 is fastened and electrically connected to the mainboard. One end of the lead-out section 660 is fastened to the fixed position N1 (not shown in the figure). The fixed position N1 is fastened and electrically connected to the circuit board B in the camera 500. The other end of the lead-out section 660 is connected to a side t, parallel to an extension direction of the sub-section W1, at one end that is of the sub-section W1 and that is away from the bent connecting part V1. An extension direction of each sub-section (namely, an extension direction of a center axis C2 of each sub-section) is, for example, perpendicular ("perpendicular" means roughly perpendicular; or may be strictly perpendicular, for example, an included angle is greater than or equal to 75° and less than or equal to 90°) to an extension direction of the lead-out section 660 (namely, a direction of a central axis C3 of the lead-out section 660). The sub-sections (W1, W2, and W3) and the bent connecting parts (V1 and V2) form a snake-shaped bent section, and the first axis L1 passes through between two of the sub-sections, so that a part of a structure of the snake-shaped bent section extends in the direction of rotation around the first axis L1. The lead-out section 660 and the snake-shaped bent section form at least a part of the bent redundant structure in the flexible circuit board 600. The entire snake-shaped bent section is, for example, located on one side of the camera 500 in the F direction, a length of the bent connecting part V1 in the direction of the second axis L2 is less than lengths of the sub-section W1 and the sub-section W2 in the direction of the second axis L2, and a length of the bent connecting part V2 in the direction of the second axis L2 is less than lengths of the sub-section W2 and the sub-section W3 in the direction of the second axis L2.

In the camera assembly provided in the embodiment corresponding to FIG. 6a and FIG. 6b, when the camera 500 swings around the first axis L1 (relative to the mainboard of the electronic device):

The sub-section W1 is driven by the lead-out section 660 to swing around the bent connecting part V1 (around an axis parallel to the first axis L1), and the sub-section W1 is bent around an axis approximately parallel to the first axis L1. Deformation of a cross section of the sub-section W1 is mainly accumulated in a thickness direction, and a deformation accumulation is small. In addition, a swing of the sub-section W1 is transferred to the sub-section W2 and the sub-section W3, and deformation of cross sections of the sub-section W2 and the sub-section W3 is also mainly accumulated in the thickness direction. After the swing of the sub-section W1 is transferred to the sub-section W2 and the sub-section W3, the deformation on each cross section is reduced. When the actuator drives the camera 500 to swing around the first axis L1, material stress of the flexible circuit board that needs to be overcome is small.

When the camera 500 swings around the second axis L2 (relative to the mainboard of the electronic device):

The sub-section W1 is driven by the lead-out section 660 to swing around the bent connecting part V1 (around the axis parallel to the second axis L2), and the swing of the sub-section W1 is transferred to the sub-section W2 and the sub-section W3. Deformation mainly occurs at the bent connecting part V1 and the bent connecting part V2, deformation on cross sections of the sub-sections (W1, W2, and W3) and the bent connecting parts (V1 and V2) is mainly accumulated in the thickness direction, and a deformation accumulation is small. When the actuator drives the camera 500 to swing around the second axis L2, material stress of the flexible circuit board that needs to be overcome is small.

When the camera 500 (relative to the mainboard of the electronic device) swings around the third axis L3:

The sub-section W1 is driven by the lead-out section 660 to swing around the bent connecting part V1 (around the axis parallel to the second axis L2). After the swing of the sub-section W1 is transferred to the sub-section W2 and the sub-section W3, it is equivalent to that deformation is distributed to each cross section of the sub-sections (W1, W2, and W3) and the bent connecting parts (V1 and V2), and the deformation of each cross section is small. When the actuator drives the camera 500 to swing around the third axis L3, material stress of the flexible circuit board that needs to be overcome is small.

In conclusion, the snake-shaped bent section and the lead-out section 660 jointly form at least a part of the bent redundant structure in the flexible circuit board 600. When the lead-out section 660 deforms under driving of the circuit board B, deformation is transferred to the snake-shaped bent section, to reduce deformation of each cross section of each flexible circuit board 600, and reduce the resistance caused when the actuator drives the camera 500 to swing. In addition, the snake-shaped bent section is an elastic structure. Stress generated when one end of the flexible circuit board 600 is driven by the camera 500 to deform may be fully absorbed by the snake-shaped bent section after being released to the snake-shaped bent section. In addition, the snake-shaped bent section has a small volume, and a length of the snake-shaped bent section is long in an extension direction. After deformation is distributed on the snake-shaped bent section, the deformation accumulation at each cross section is small. This helps reduce resistance of the flexible circuit board 600 that needs to be overcome when the actuator drives the camera 500.

In the embodiment provided in FIG. 6a and FIG. 6b, the central axis C2 of each sub-section may not be parallel to the second axis L2, or may form an angle with the second axis L2 (for example, less than or equal to 30°). In addition, the first axis L1 and the second axis L2 are interchangeable.

Figure 7:
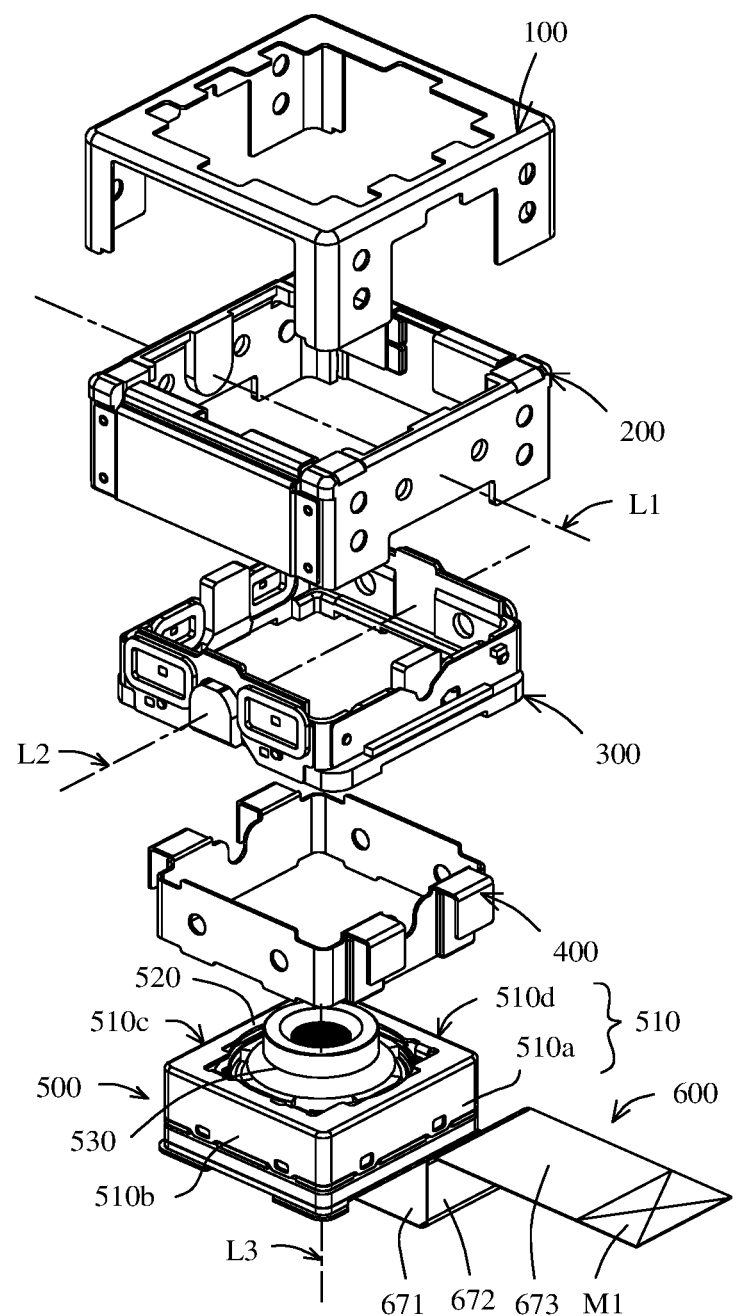
FIG. 7 is an exploded view of another camera assembly according to an embodiment of this disclosure.

FIG. 7 is an exploded view of another camera assembly from an angle of view according to an embodiment of this disclosure. Refer to FIG. 7. A difference between the camera assembly shown in FIG. 7 and the camera assembly shown in FIG. 1a lies in that: The flexible circuit board 600 includes a lead-out section 671, a sub-section 672, and a sub-section 673. One end of the lead-out section 671 is fastened to the fixed position N1, the fixed position N1 is fastened and electrically connected to the circuit board B in the camera 500, the lead-out section 671 extends to the outside of the housing 100 in a direction parallel to the backplane of the camera 500, another end of the lead-out section 671 is bent to be connected to one end of the sub-section 672, the sub-section 672 extends in the direction of the third axis L3, the other end of the sub-section 672 is bent to be connected to one end of the sub-section 673, the sub-section 673 extends in the direction of the first axis L1, the other end of the sub-section 673 is fastened to the fixed position M1, and the fixed position M1 is fastened and electrically connected to the mainboard. The lead-out section 671, the sub-section 672, and the sub-section 673 are sequentially bent and connected to form a bent redundant structure. The redundant structure is in a bent form instead of extending in a straight line direction, and any point in the middle of the redundant structure is not fastened and can be freely bent and deformed. When the camera 500 swings around one or more of the first axis L1, the second axis L2, and the third axis L3, stress may be distributed to the redundant structure, and resistance that needs to be overcome when the actuator drives the camera 500 to swing is reduced.

It should be noted that, in various camera assemblies shown in FIG. 1a to FIG. 7, the flexible circuit board 600 is in a natural state when no force is applied.

In the foregoing embodiments, only the stress of the flexible circuit board 600 that needs to be overcome by the actuator when the camera 500 swings around the first axis L1, the second axis L2, and the third axis L3 is described. When the camera 500 swings around any two of the foregoing three axes, in this case, deformation of the flexible circuit board 600 is a combination of deformation of the flexible circuit board 600 corresponding to the foregoing two axes, and the actuator can drive the camera 500 to swing flexibly without overcoming large stress. This is similar when the camera 500 swings around the foregoing three axes at the same time.

In each of the foregoing embodiments, the flexible circuit board 600 includes the fixed position M1 and the fixed position N1. The fixed position M1 is fastened and electrically connected to the mainboard, and the fixed position N1 is fastened and electrically connected to the circuit board B in the camera 500. The fixed position M1 and the fixed position N1 are respectively two ends in the extension direction of the flexible circuit board 600. In other words, the fixed position M1 is one end in the extension direction of the flexible circuit board B, and the fixed position N1 is the other end in the extension direction of the flexible circuit board B. In the foregoing embodiments, one end (for example, one end of the lead-out section 630 in FIG. 1c) in the extension direction of the redundant structure is directly connected to the fixed position M1, and the other end (for example, one end of the extension section 620 in FIG. 1b) is connected to the fixed position N1. In some other cases, connection sections may further exist between the redundant structure and the fixed position M1 and between the redundant structure and the fixed position N1, and connect an end of the redundant structure to a corresponding fixed position.

Based on a same inventive concept, an embodiment of this disclosure further provides an electronic device. The electronic device includes the camera assembly and the mainboard provided in the foregoing embodiments. An end (a free end) that is of a flexible circuit board in the camera assembly and that is away from a camera is electrically connected to the mainboard. The electronic device may be an electronic device that easily shakes when being used and that has an image capture function, for example, a mobile terminal, a dashboard camera, an action camera, or a drone platform. The mobile terminal is, for example, a mobile phone, a tablet computer, a bar code scanner, an RFID reader, or a POS terminal. The camera assembly is used in the foregoing electronic device to capture an image. Refer to FIG. 1a to FIG. 6a. The camera assembly is used in the electronic device. Therefore, when the camera 500 is used to capture an image in a shaking environment, and the camera 500 swings around at least one of the first axis L1, the second axis L2, and the third axis L3 by using the redundant structure in the flexible circuit board 600, all material stress generated by the flexible circuit board 600 can be released in the redundant structure. In this way, the resistance caused when the actuator drives the camera 500 is reduced, and the stabilization effect when the electronic device uses the camera 500 to shoot is improved.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A camera assembly comprising:
   a camera capable of swinging around at least one of a first axis, a second axis, and a third axis, wherein the third axis is an optical axis of the camera; and
   a flexible circuit board, wherein in an extension direction of the flexible circuit board, one end of the flexible circuit board is connected to a circuit board in the camera, the other end of the flexible circuit board is fastened and electrically connected to a mainboard, the flexible circuit board includes a bent redundant structure configured to release stress between the two ends of the flexible circuit board, and the redundant structure is capable of extending in a direction of rotation around at least one of the first axis, the second axis, or the third axis;
   wherein the redundant structure comprises a spiral section; and
   wherein the redundant structure further comprises a lead-out section, one end of the lead-out section is connected to the circuit board in the camera, and the other end of the lead-out section is connected to the spiral section.

2. The camera assembly according to claim 1, wherein the spiral section extends spirally around a central axis of the lead-out section.

3. The camera assembly according to claim 1, wherein the camera further comprises a panel, a backplane, and a surrounding wall, the panel and the backplane are arranged in a direction of the third axis and disposed opposite to each other, and the surrounding wall connects the panel to the backplane; and the redundant structure comprises a winding section wound along at least a part of the surrounding wall.

4. The camera assembly according to claim 3, wherein the redundant structure further comprises another lead-out section, wherein one end of the other lead-out section is connected to the circuit board in the camera, and the other end of the other lead-out section is connected to the winding section.

5. The camera assembly according to claim 3, wherein the camera assembly further comprises an enclosure, the enclosure is disposed around the surrounding wall, a gap exists between the enclosure and the surrounding wall, and the winding section is located in the gap between the surrounding wall and the enclosure.

6. The camera assembly according to claim 5, wherein the redundant structure comprises an extension section; and in an extension direction of the winding section, a side of one end that is of the winding section and that is far away from the circuit board of the camera is connected to one end of the extension section, and the other end of the extension section extends out of the enclosure.

7. A camera assembly comprising:

a camera capable of swinging around at least one of a first axis, a second axis, and a third axis, wherein the third axis is an optical axis of the camera; and a flexible circuit board, wherein in an extension direction of the flexible circuit board, one end of the flexible circuit board is connected to a circuit board in the camera, the other end of the flexible circuit board is fastened and electrically connected to a mainboard, the flexible circuit board includes a bent redundant structure configured to release stress between the two ends of the flexible circuit board, and the redundant structure is capable of extending in a direction of rotation around at least one of the first axis, the second axis, or the third axis; wherein the redundant structure comprises a snake-shaped bent section; and the snake-shaped bent section comprises a plurality of sub-sections that are successively opposite to each other and disposed in parallel, wherein one end of each sub-section located between two sub-sections is connected to a corresponding end of a sub-section on one side in the two sub-sections through a bent connecting part, and the other end of the sub-section is connected to a corresponding end of a sub-section on the other side in the two sub-sections through another bent connecting part.

8. The camera assembly according to claim 7, wherein the redundant structure further comprises a lead-out section, wherein one end of the lead-out section is connected to the circuit board in the camera, and the other end of the lead-out section is connected to the snake-shaped bent section.

9. The camera assembly according to claim 8, wherein a gap extending in an extension direction of the lead-out section is disposed in a middle part of the lead-out section.

10. The camera assembly according to claim 8, wherein an extension direction of each sub-section of the snake-shaped bent section is parallel to the extension direction of the lead-out section.

11. The camera assembly according to claim 10, wherein in at least a part of the sub-sections, a gap extending in an extension direction of each sub-section is disposed in a middle part of the sub-section.

12. The camera assembly according to claim 8, wherein an extension direction of each sub-section of the snake-shaped bent section is perpendicular to the extension direction of the lead-out section.

13. The camera assembly according to claim 12, wherein every two adjacent sub-sections are connected through a bent connecting part, and two bent connecting parts connecting each sub-section located between two sub-sections are located on two sides of a central axis of the sub-section.

14. The camera assembly according to claim 12, wherein each bent connecting part extends along a side in an extension direction of an adjacent sub-section.

15. An electronic device, comprising a mainboard and a camera assembly;

the camera assembly comprising:

a camera capable of swinging around at least one of a first axis, a second axis, and a third axis, wherein the third axis is an optical axis of the camera; and a flexible circuit board, wherein in an extension direction of the flexible circuit board, one end of the flexible circuit board is connected to a circuit board in the camera, the other end of the flexible circuit board is fastened and electrically connected to a mainboard, the flexible circuit board includes a bent redundant structure configured to release stress between the two ends of the flexible circuit board, and the redundant structure is capable of extending in a direction of rotation around at least one of the first axis, the second axis, or the third axis; and wherein in the extension direction of the flexible circuit board, one end that is of the flexible circuit board and that is away from the circuit board in the camera is electrically connected to the mainboard;

wherein the redundant structure comprises a spiral section; and wherein the redundant structure further comprises a lead-out section, one end of the lead-out section is connected to the circuit board in the camera, and the other end of the lead-out section is connected to the spiral section.

16. The electronic device according to claim 15, wherein the spiral section extends spirally around a central axis of the lead-out section.

17. The electronic device according to claim 15, wherein the camera further comprises a panel, a backplane, and a surrounding wall, the panel and the backplane are arranged in a direction of the third axis and disposed opposite to each other, and the surrounding wall connects the panel to the backplane; and the redundant structure comprises a winding section wound along at least a part of the surrounding wall.

18. The electronic device according to claim 17, wherein the redundant structure further comprises another lead-out section, wherein one end of the other lead-out section is connected to the circuit board in the camera, and the other end of the other lead-out section is connected to the winding section.

19. The electronic device according to claim 17, wherein the camera assembly further comprises an enclosure, the enclosure is disposed around the surrounding wall, a gap exists between the enclosure and the surrounding wall, and the winding section is located in the gap between the surrounding wall and the enclosure.

20. The electronic device according to claim 19, wherein the redundant structure comprises an extension section; and in an extension direction of the winding section, a side of one end that is of the winding section and that is far away from the circuit board of the camera is connected to one end of the extension section, and the other end of the extension section extends out of the enclosure.

* * * * *